(12) United States Patent
Mizutani et al.

(10) Patent No.: US 8,026,045 B2
(45) Date of Patent: Sep. 27, 2011

(54) METHOD OF MANUFACTURING WIRING CIRCUIT BOARD

(75) Inventors: Masaki Mizutani, Ibaraki (JP); Hirofumi Fujii, Ibaraki (JP)

(73) Assignee: Nitto Denko Corporation, Moriguchi-shi, Osaka (JP)

( * ) Notice: Subject to any disclaimer, the term of this patent is extended or adjusted under 35 U.S.C. 154(b) by 532 days.

(21) Appl. No.: 12/055,711

(22) Filed: Mar. 26, 2008

(65) Prior Publication Data

US 2008/0241759 A1    Oct. 2, 2008

(30) Foreign Application Priority Data

Mar. 26, 2007    (JP) .................. 2007-079623

(51) Int. Cl.
    *G03F 7/26*    (2006.01)
(52) U.S. Cl. ....................... 430/319; 430/328
(58) Field of Classification Search .............. 430/315, 430/328, 394, 270.1, 319, 311
    See application file for complete search history.

(56) References Cited

U.S. PATENT DOCUMENTS

| | | | |
|---|---|---|---|
| 4,885,229 A | 12/1989 | Takenaka et al. | |
| 5,849,460 A | 12/1998 | Kawai et al. | |
| 7,078,151 B2 | 7/2006 | Aoki et al. | |
| 2003/0092802 A1* | 5/2003 | Nakacho et al. | 524/86 |
| 2003/0194655 A1* | 10/2003 | Jong | 430/313 |
| 2004/0018446 A1 | 1/2004 | Aoki et al. | |
| 2005/0004288 A1* | 1/2005 | Koyanagi et al. | 524/274 |
| 2008/0020490 A1 | 1/2008 | Kitahara et al. | |
| 2008/0063955 A1* | 3/2008 | Fujii et al. | 430/18 |

FOREIGN PATENT DOCUMENTS

| | | |
|---|---|---|
| CN | 1124912 A | 6/1996 |
| EP | 0321618 A1 | 6/1989 |
| EP | 1416003 A1 | 5/2004 |
| EP | 1894952 A1 | 3/2008 |
| JP | 01038179 A | 2/1989 |
| JP | 07-207211 A | 8/1995 |
| JP | 08-41167 A | 2/1996 |
| JP | 08-134390 A | 5/1996 |
| JP | 09-005997 A | 1/1997 |
| JP | 11-166035 A | 6/1999 |
| JP | 11-279258 A | 10/1999 |
| JP | 2001-072836 A | 3/2001 |

(Continued)

OTHER PUBLICATIONS

European Search Report dated Sep. 26, 2008, issued in corresponding European Patent Application No. 08005348.1.

(Continued)

*Primary Examiner* — Kathleen Duda
*Assistant Examiner* — Caleen Sullivan
(74) *Attorney, Agent, or Firm* — Westerman, Hattori, Daniels & Adrian, LLP

(57) ABSTRACT

A conductor circuit (2) having a predetermined pattern is formed on a base material (1); a photosensitive resin composition layer is formed on a surface of the base material, on which the conductor circuit (2) having the predetermined pattern is formed, by using a photosensitive resin composition; a surface of the photosensitive resin composition layer is irradiated with and exposed to active light rays through a photomask having a predetermined pattern; a solder resist layer (3a) having a predetermined pattern is formed by using a developing solution; and the formed solder resist layer (3a) is irradiated with ultraviolet light by using a low-pressure mercury-vapor lamp.

2 Claims, 2 Drawing Sheets

FOREIGN PATENT DOCUMENTS

| | | |
|---|---|---|
| JP | 2002-265567 A | 9/2002 |
| JP | 2003-155320 A | 5/2003 |
| JP | 2004-043662 A | 2/2004 |
| JP | 2005-173577 A | 6/2005 |
| JP | 2005-266494 A | 9/2005 |
| JP | 2005-283762 A | 10/2005 |

OTHER PUBLICATIONS

Sham, M. I. et al.; "Improved Underfill Adhesion in Flip-Chip Packages by Means of Ultraviolet Light/Ozone Treatment"; IEEE Transactions on Advanced Packaging, vol. 27, No. 1, pp. 179-187, Feb. 2004.

Ging-Ho Hisiue et al.; "Synthesis, Characterization, Thermal and Flame-Retardant Properties of Silicon-Based Epoxy Resins"; Journal of Applied Polymer Science, vol. 73, pp. 1231-1238, 1999.

European Search Report dated Feb. 9, 2009, issued in corresponding European Patent Application No. 07016854.7.

Thomson Scientific, Database WPI Week 200167, London, GB, AN 2001-592249, P-002510968.

U.S. Office Action dated Jun. 2, 2009, issued in U.S. Appl. No. 11/847,710.

U.S. Office Action dated Oct. 6, 2008, issued in U.S. Appl. No. 11/847,710.

U.S. Office Action dated Nov. 28, 2008, issued in U.S. Appl. No. 11/847,710.

Japanese Office Action dated Mar. 8, 2011 issued for Japanese Patent Application No. 2007-079623.

Chinese Office Action dated May 19, 2011, issued in corresponding Chinese Patent Application No. 200810161180.6.

National Office of Intellectual Property of Vietnam Office Action dated Jun. 30, 2011, issued in corresponding Vietnamese Patent Application No. 1-2008-00750.

\* cited by examiner

METHOD OF MANUFACTURING WIRING CIRCUIT BOARD

BACKGROUND OF THE INVENTION

1. Field of the Invention

The present invention relates to a method of manufacturing a wiring circuit board formed with a solder resist layer.

2. Description of the Related Art

It has been conventional practice to provide a heat-resistant material known as a solder resist in a required portion of a wiring circuit board, on which electronic components are to be mounted, by using a screen printing technique and an exposure and development technique to provide a solder resist layer on a conductor pattern of the wiring circuit board.

A material for the formation of such a solder resist layer generally incorporates additives such as a flame retardant and a pigment, in addition to a polymeric material serving as a main ingredient. The use of these additives imparts a characteristic of flame retardancy to the solder resist layer. In recent years, it has been proposed to use as a resist material, for example, a photosensitive resin composition incorporating, a cyclic phosphazene compound serving as the above-mentioned flame retardant, without using halogen flame retardants, for the formation of the solder resist layer from the viewpoint of environmental issues (as disclosed, for example, in Japanese Patent Application Laid-Open No. 2005-266494).

There has, however, arisen such a problem that when a wiring circuit board formed with a solder resist layer employing the above-mentioned photosensitive resin composition is used or left standing in a high-temperature and high-humidity atmosphere, various additives contained in the solder resist layer separate out, which results in contamination of a product. In particular, the above-mentioned cyclic phosphazene compound tends to easily separate out, thereby becoming a problem. In the manufacture of the wiring circuit board, on the other hand, it has been a common practice to carry out an inspection step to thereby remove contaminants and the like remaining on the surface of the wiring circuit board by using a material impregnated with an organic solvent such as ethanol. However, there has been another problem, that is, the solder resist layer dissolves into the organic solvent such as ethanol it the curing of the solder resist layer is insufficient.

SUMMARY OF THE INVENTION

It is therefore an object of the present invention to provide a method of manufacturing a wiring circuit board which is capable of suppressing the separating of additives out of a solder resist layer, particularly the separating of additives in a high-temperature and high-humidity atmosphere, and which improves the curability of the solder resist layer.

To accomplish the above-mentioned object, a method of manufacturing a wiring circuit board according to the present invention comprises the steps of: forming a predetermined conductor circuit pattern on a base material and thereafter forming a photosensitive resin composition layer on a surface of the base material on which the conductor circuit pattern has been formed by using a photosensitive resin composition; irradiating a surface of the photosensitive resin composition layer with active light rays through a photomask having a predetermined pattern and exposing the surface of the photosensitive resin composition layer to the active light rays; and forming a solder resist layer having a predetermined pattern by using a developing solution after the exposure step, wherein the solder resist layer is irradiated with ultraviolet light by using a low-pressure mercury-vapor lamp.

The present inventors have diligently studied principally on the manufacturing process to find out an effective means capable of suppressing the separating of additives from the solder resist layer formed on the conductor circuit pattern of the wiring circuit board. As a result, the present inventors have found out that the technique of forming the solder resist layer into a predetermined pattern by using a photosensitive resin composition and then irradiating the solder resist layer surface with ultraviolet light by the use of the low-pressure mercury-vapor lamp suppresses the separating of the additives even under the conditions of a high-temperature and high-humidity atmosphere, and also suppresses the dissolution of the solder resist layer in the process of removing contaminants and the like from the surface of the wring circuit board after the manufacture of the wiring circuit board. That is, the followings have been found out that the irradiation of the solder resist layer surface with ultraviolet light by the use of the low-pressure mercury-vapor lamp as described above causes a photo-curing reaction of the photosensitive resin component in the solder resist layer to improve the curability thereof, thereby suppressing the separating of the additives, and that the improvement in the curability of the solder resist layer suppresses the dissolution of the solder resist layer in the process of removing contaminants and the like. Thus, the present inventors have attained the present invention which accomplishes their intended object.

As described above, the method of manufacturing the wiring circuit board according to the present invention comprises the steps of: forming a photosensitive resin composition layer on a surface of a base material on which a conductor circuit pattern is formed by using a photosensitive resin composition; then irradiating the surface of the photosensitive resin composition layer with active light rays through a photomask having a predetermined pattern, and exposing the surface of the photosensitive resin composition layer to the active light rays; forming a solder resist layer having a predetermined pattern by using a developing solution after the exposure step, and irradiating the formed solder resist layer with ultraviolet light by using a low-pressure mercury-vapor lamp. This suppresses the separating of additives serving as the material for the formation of the solder resist layer out from the solder resist layer to prevent the occurrence of product contamination, even if the wiring circuit board is used, or stored or left standing in a high-temperature and high-humidity atmosphere. Additionally, the irradiation with ultraviolet light by the use of the above-mentioned low-pressure mercury-vapor lamp improves the curability of the surface of the solder resist layer. This produces the effect of suppressing the dissolution of the solder resist layer in the process of removing contaminants and the like, as described above.

The above-mentioned manufacturing method is particularly effective when the material for the formation of the solder resist layer contains a cyclic phosphazene compound which is a flame retardant.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
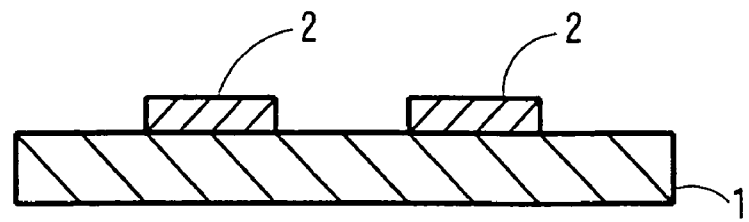
FIGS. 1 through 4 are views schematically illustrating the manufacturing process of a wiring circuit board according to the present invention.

In a method of manufacturing a wiring circuit board according to the present invention, for example, a predetermined conductor circuit pattern is formed on a base material. Thereafter, a photosensitive resin composition is used to form a photosensitive resin composition layer on a surface of the base material on which the above-mentioned conductor circuit pattern is formed. Next, a surface of the above-mentioned photosensitive resin composition layer is irradiated with (i.e., exposed to) active light rays through a photomask having a predetermined pattern. Thereafter, development is performed by using a developing solution to form a solder resist layer having a predetermined pattern. Next, a low-pressure mercury-vapor lamp is used to irradiate the formed solder resist layer with ultraviolet light. In this manner, the wiring circuit board is manufactured. The greatest characteristic of the present invention is to further irradiate the formed solder resist layer with ultraviolet light by using the low-pressure mercury-vapor lamp.

The above-mentioned base material is not particularly limited if the base material has an insulating property. Various high-molecular compound materials may be used as the base material, and examples thereof are polyimide and the like.

A material for the formation of the above-mentioned conductor circuit pattern is not particularly limited if the material has conductivity. In general, copper foil and the like are used as the material for the formation of the conductor circuit pattern.

An example of the photosensitive resin composition which is the material for the formation of the above-mentioned solder resist layer includes a composition obtained by using a carboxyl-group-containing linear polymer (component A) produced by addition polymerization of an ethylene unsaturated compound, an ethylene-unsaturated-group-containing polymerizable compound (component B), a photopolymerization initiator (component C), and a phosphorus-containing epoxy resin (component D).

The above-mentioned carboxyl-group-containing linear polymer (component A) is obtained by the addition polymerization of an ethylene unsaturated compound, and may be obtained by copolymerizing (meth)acrylic acid, a carboxyl-containing styrene derivative, maleic anhydride and the like. The physical properties, such as glass transition temperature (Tg) and the like, of the linear polymer obtained by this method, are easy to design because the acid equivalent is controllable in an arbitrary manner and there are abundant raw material monomeric species.

The weight-average molecular weight of the above-mentioned carboxyl-group-containing linear polymer (component A) is preferably in the range of 5000 to 100000, more preferably in the range of 6000 to 80000, particularly preferably in the range of 7000 to 60000. Specifically, physical properties such as solder heat resistance tend to deteriorate when the weight-average molecular weight is less than 5000, and alkali developability tends to deteriorate when the weight-average molecular weight is greater than 100000.

The acid equivalent of the above-mentioned carboxyl-group-containing linear polymer (component A) is preferably in the range of 200 to 900, more preferably in the range of 250 to 850, still more preferably in the range of 300 to 800. Specifically, the acid equivalent of less than 200 is not preferable because this promotes the oxidation of copper under high-temperature and high-humidity conditions, and alkali developability tends to deteriorate when the acid equivalent is greater than 900.

The above-mentioned carboxyl-group-containing linear polymer (component A) preferably contains, for example, phenoxyethyl (meth)acrylate as a copolymer component so that heat resistance and the effect of suppressing warpage are imparted to the carboxyl-group-containing linear polymer (component A).

Thus, an example of the above-mentioned carboxyl-group-containing linear polymer (component A) is a polymer obtained by copolymerizing phenoxyethyl (meth)acrylate, (meth)acrylic acid and other vinyl monomers.

Examples of the above-mentioned other vinyl monomers include alkyl esters of (meth)acrylic acid such as (meth)acrylicmethyl ester, (meth)acrylicethyl ester, and (meth)acrylic butyl ester, (meth)acrylic acid 2-ethylhexyl ester, (meth)acrylic acid tetrahydrofurfuryl ester, (meth)acrylic acid dimethylaminoethyl ester, (meth)acrylic acid diethylaminoethyl ester, styrene, α-styrene, vinyltoluene, N-vinylpyrrolidone, (meth)acrylic acid 2-hydroxyethyl ester, acrylamide, acrylonitrile, methacrylonitrile, N-phenylmaleimide, and cyclohexylmaleimide. These are used alone or in combination.

The amount of copolymerization of (meth)acrylic acid which is the above-mentioned copolymer component is preferably set within the range of 8% to 40% by weight, more preferably within the range of 10% to 35% by weight, based on the total amount of copolymer component. Specifically, workability tends to deteriorate because of the prolonged developing time when the amount of copolymerization is less than 8% by weight, and the oxidation of copper under high-temperature and high-humidity conditions tends to be promoted when the amount of copolymerization is greater than 40% by weight.

An ethylene unsaturated group or the like may be introduced into the above-mentioned carboxyl-group-containing linear polymer (component A) by a polymer reaction after polymerization. When an ethylene unsaturated group is introduced into a carboxyl group of a copolymer obtained using the above-mentioned monomer components by reaction with glycidyl acrylate and the like after polymerization, it is preferable to increase the amount of copolymerization of the above-mentioned (meth)acrylic acid in consideration of the amount of carboxyl group which will disappear due to the reaction after the introduction of the ethylene unsaturated group. An ethylene unsaturated compound which allows a carboxyl group to be introduced into a linear polymer of the ethylene unsaturated compound is not limited to the above-mentioned (meth)acrylic acid, but may include, for example, a styrene derivative, a maleic anhydride derivative, and the like.

The ethylene-unsaturated-group-containing polymerizable compound (component B) for use with the above-mentioned component A is not particularly limited. Because of its good balance of characteristics such as solder heat resistance, folding endurance and alkali developability, the component B is preferably a bisphenol A (meth)acrylate compound represented by the general formula:

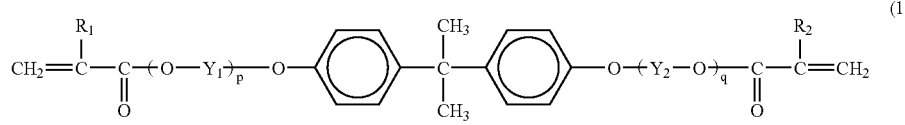

(1)

where $R_1$ and $R_2$ may be identical with or different from each other, and are each independently selected from the group consisting of a hydrogen atom and a methyl group; $Y_1$ and $Y_2$ may be identical with or different from each other, and are each independently an alkylene group having a carbon number ranging from 2 to 6; and p and q are positive integers selected so that the sum thereof (p+q) is in the range of 4 to 40.

In Formula (1), examples of the alkylene group having a carbon number ranging from 2 to 6 include an ethylene group, a propylene group, an isopropylene group, a butylene group, an isobutylene group, a pentylene group, a neopentylene group, and a hexylene group. In particular, an ethylene group is preferable.

The above-mentioned isopropylene group is a group represented by $—CH(CH_3)CH_2—$. There are two types of bond orientations of the isopropylene group in $—(O—Y_1)—$ and $—(Y_2—O)—$ in the above-mentioned general formula (1); one type of bonding orientation is such that the methylene group is bonded to oxygen; and the other type is such that the methylene group is not bonded to oxygen. One or both of the two types of bond orientations of the isopropylene group may be used herein.

When there are at least two repeating units of $—(O—Y_1)—$ and $—(Y_2—O)—$, at least two groups $Y_1$ and at least two groups $Y_2$ may be identical with or different from each other. When $Y_1$ and $Y_2$ are composed of at least two types of alkylene groups, at least two repeating units of $—(O—Y_1)—$ and $—(Y_2—O)—$ may be present in a random or block fashion.

The above-mentioned general formula (1) may have at least one substituent in any replaceable position of the two benzene rings. When the formula (1) has at least two substituents, the at least two substituents may be identical with or different from each other. Examples of such substituent include an alkyl group having a carbon number ranging from 1 to 20, a cycloalkyl group having a carbon number ranging from 3 to 10, an aryl group having a carbon number ranging from 6 to 14, an amino group, a nitro group, a cyano group, a mercapto group, an allyl group, an alkylmercapto group having a carbon number ranging from 1 to 10, a hydroxyalkyl group having a carbon number ranging from 1 to 20, a carboxyalkyl group including an alkyl group having a carbon number ranging from 1 to 10, an acyl group including an alkyl group having a carbon number ranging from 1 to 10, an alkoxy group having a carbon number ranging from 1 to 20, and a group containing a heterocycle.

The numbers of repetitions p and q in the above-mentioned general formula (1) are positive integers selected so that the sum thereof (p+q) is in the range of 4 to 40, more preferably positive integers selected so that the sum thereof (p+q) is in the range of 4 to 15, particularly preferably positive integers selected so that the sum thereof (p+q) is in the range of 5 to 13. Specifically, the folding endurance tends to increase in addition to the increase in warpage when the sum (p+q) is less than 4, and the entire system of the photosensitive resin composition exhibits a hydrophilicity and insulation reliability tends to deteriorate under high-temperature and high-humidity conditions when the sum (p+q) is greater than 40.

Specific examples of the bisphenol A (meth)acrylate compound represented by the above-mentioned general formula (1) include 2,2'-bis[4-((meth)acryloxydiethoxy)phenyl]propane, 2,2'-bis[4-((meth)acryloxytetraethoxy)phenyl]propane, 2,2'-bis[4-((meth)acryloxypentaethoxy)phenyl]propane, 2,2'-bis[4-((meth)acryloxydiethoxy-octapropoxy)phenyl]propane, and 2,2'-bis[4-((meth)acryloxytriethoxy-octapropoxy)phenyl]propane. These are used alone or in combination.

Examples of the photopolymerization initiator (component C) for use with the above-mentioned components A and B include substituted or unsubstituted polynuclear quinones (2-ethylanthraquinone, 2-t-butylanthraquinone, octamethylanthraquinone, 1,2-benzanthraquinone, 2,3-diphenylanthraquinone, and the like), α-ketaldonyl alcohols (benzoin, pivalon, and the like), ethers, α-hydrocarbon substituted aromatic acyloins (α-phenyl-benzoin, α,α-diethoxyacetophenone, and the like), aromatic ketones (benzophenone, 4,4'-bisdialkylaminobenzophenone such as N,N'-tetraethyl-4,4'-diaminobenzophenone), thioxanthones (2-methylthioxanthone, 2,4-diethylthioxanthone, 2-chlorthioxanthone, 2-isopropylthioxanthone, 2-ethylthioxanthone, and the like), 2-methyl-1-[4-(methylthio)phenyl]-morpholinopropane-1-on, and the like. These are used alone or in combination.

An example of the phosphorus—containing epoxy resin (component D) for use with the above-mentioned components A to C includes an epoxy resin containing at least 2% by weight of phosphorus atoms, based on the total molecular weight. The above-mentioned component D serves as a flame retardant. The component D, which contains no halogen elements, is environmentally friendly because of non-halogenation. Additionally, the component D is preferable in being able to provide flame retardancy without impairing the physical properties such as insulation reliability and developability.

It is difficult to provide sufficient flame retardancy when the phosphorus atom content is as low as less than 2% by weight based on the molecular weight in the above-mentioned component D. The phosphorus atom content described above is not particularly limited, but compatibility with the epoxy resin deteriorates in some cases when the phosphorus atom content is not less than 5% by weight.

Examples of the component D include a flame-retardant epoxy resin containing nitrogen atoms and phosphorus atoms at the same time, as disclosed in Journal of Applied Polymer Science 73, 353 (1999), which is herein incorporated by reference, and a phosphorus-containing epoxy resin containing a bisphenyl phosphate skeleton represented by the general formula:

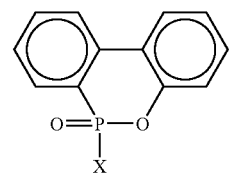

(2)

where X is an aromatic group having at least two substituents with epoxy groups at ends.

Examples of the aromatic group having at least two epoxy groups at ends for X in Formula (2) include a novolac resin derivative, a bisphenol derivative and the like. Additionally, a plurality of bisphenyl phosphate skeletons may be contained in one molecule.

Specific examples of the phosphorus-containing epoxy resin containing a bisphenyl phosphate skeleton represented by the general formula (2) include epoxy resins disclosed in Japanese Patent No. 3613724 and Japanese Patent No. 3533973, and an epoxy resin disclosed in Journal of Applied Polymer Science 73, 1231 (1999), which are herein incorporated by reference, and represented by the structural formula:

(2a)

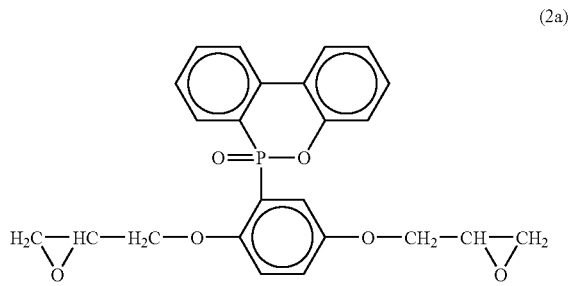

The phosphorus-containing epoxy resin (component D) having an epoxy equivalent ranging from 300 to 500 is preferably used in terms of warpage resulting from shrinkage on curing and solder resistance. Additionally, phosphorus-containing epoxy resin (component D) having a weight-average molecular weight of not greater than 1000 is preferably used.

According to the present invention, a cyclic phosphazene compound (component E) may be used in addition to the above-mentioned components A to D for purposes of compatibility between flame retardancy, warpage, and solder resistance. A specific example of the above-mentioned cyclic phosphazene compound (component E) includes a cyclic phenoxyphosphazene compound represented by the general formula:

(3)

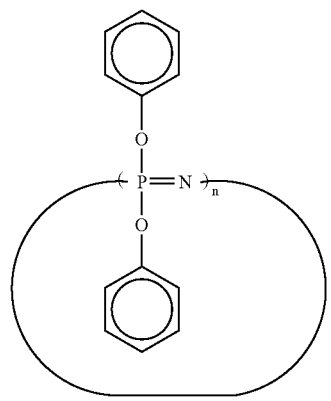

where n is a positive integer ranging from 3 to 10.

In Formula (3), the number of repetitions n is in the range of 3 to 10, more preferably in the range of 3 to 5.

Such a cyclic phenoxyphosphazene compound represented by the general formula (3) is available, for example, as SPE-100 from Otsuka Chemical Co., Ltd.

The contents of the respective components are preferably set in a manner to be described below when the above-mentioned components A to D are used in the above-mentioned photosensitive resin composition for use as the material for the formation of the solder resist layer according to the present invention, as well as when the component E is additionally used. The content of the above-mentioned component A in the entire photosensitive resin composition is preferably set within the range of 20% to 60% by weight. Specifically, the rate of development is lowered in some cases when the content is less than 20% by weight, and the flame retardancy tends to be insufficient when the content is greater than 60% by weight.

The content of the above-mentioned component B in the entire photosensitive resin composition is preferably set within the range of 5% to 40% by weight, more preferably within the range of 8% to 30% by weight. Specifically, sensitivity during the exposure of the photosensitive resin composition to light tends to deteriorate when the content is less than 5% by weight, and alkali developability tends to deteriorate when the content is greater than 40% by weight.

The content of the above-mentioned component C in the entire photosensitive resin composition is preferably set within the range of 0.2% to 10% by weight, more preferably within the range of 0.3% to 8% by weight. Specifically, the sensitivity tends to be insufficient when the content is less than 0.2% by weight, and alkali developability tends to deteriorate when the content is greater than 10% by weight.

The content of the above-mentioned component D in the entire nonvolatile component of the photosensitive resin composition is preferably set within the range of 5% to 40% by weight, more preferably within the range of 7% to 35% by weight. Specifically, the flame retardancy tends to be insufficient when the content is less than 5% by weight, and warpage occurs in the wiring circuit board and tends to increase when the content is greater than 40% by weight.

The content of the above-mentioned component E in the entire photosensitive resin composition is preferably set to not greater than 20% by weight, more preferably within the range of 5% to 20% by weight. Specifically, the component E tends to separate out when the content is greater than 20% by weight.

Other additives may be mixed with the above-mentioned photosensitive resin composition, as required, in addition to the above-mentioned components. Examples of the additives include pigments such as phthalocyanine green and phthalocyanine blue, fillers such as silica, barium sulfate, and talc, an antifoaming agent, a leveling agent, a flame retardant other than the above-mentioned component E, a stabilizer, adhesion imparting agents such as 2-amino-5-mercapto-1,3,4-thiadiazole, and 5-amino-1-H-tetrazole, rust inhibitors such as benzotriazole, an epoxy resin other than the above-mentioned component D, and thermal cross-linking agents such as blocked isocyanate. These are used alone or in combination. These other additives are preferably used within the range of 0.01% to 40% by weight based on the entire photosensitive resin composition.

The above-mentioned photosensitive resin composition is obtained by mixing the above-mentioned components so that the predetermined contents are reached. The above-mentioned photosensitive resin composition may be used by mixing with an organic solvent, as required. The above-mentioned organic solvent is not particularly limited. Examples of the above-mentioned organic solvent include solvents such as diethylene glycol monoethyl ether acetate, diethylene glycol monobutyl ether acetate, diethylene glycol monoethyl ether, diethylene glycol monomethyl ether, solvent naphtha, N-methylpyrrolidone, γ-butyrolactone, butyl cellosolve, ethyl cellosolve, methyl cellosolve, toluene, xylene, mesitylene, acetone, methyl ethyl ketone, and methyl isobutyl ketone, or mixtures thereof.

The amount of the above-mentioned organic solvent, when used, is not particularly limited. However, approximately 0 to 200 parts by weight of the organic solvent may be mixed with 100 parts by weight of the photosensitive resin composition.

A detailed description will be made of the manufacturing process in the case where the above-mentioned photosensitive resin composition is used as the material for the formation of the solder resist layer for the wiring circuit board, in addition to the manufacturing process of the wiring circuit board discussed above.

Figure 2:
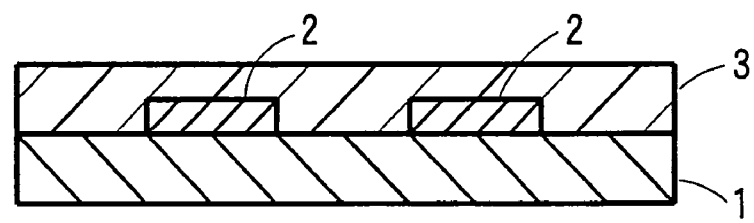

First, as shown in FIG. 1, a conductor circuit 2 having a predetermined pattern is formed on a base material 1 by a conventionally known method. Next, as shown in FIG. 2, a photosensitive resin composition is applied onto a surface of the base material 1, on which the above-mentioned conductor circuit 2 is formed, by a coating method such as a screen printing method, a spraying method, a roll coating method, or an electrostatic painting method such that the thickness of the photosensitive resin composition after drying is in the range of 5 to 50 μm. Then, the applied photosensitive resin composition is dried at a temperature of 5° C. to 120° C. for approximately 3 to 60 minutes to form a photosensitive resin composition layer 3.

The method of forming the above-mentioned photosensitive resin composition layer 3 is not particularly limited. Other than the application of the photosensitive resin composition, the method may include, for example, preparing a dry film of the photosensitive resin composition, and affixing the dry film onto the surface of the base material 1 on which the conductor circuit 2 is formed, thereby forming the photosensitive resin composition layer 3. The above-mentioned dry film may be obtained, for example, by coating a support film with the photosensitive resin composition in a manner as described above so that the photosensitive resin composition has a predetermined thickness, then drying the photosensitive resin composition under predetermined conditions (at a temperature of 5° C. to 120° C. for approximately 3 to 60 minutes), and removing the photosensitive resin composition layer from the support film.

Figure 3:
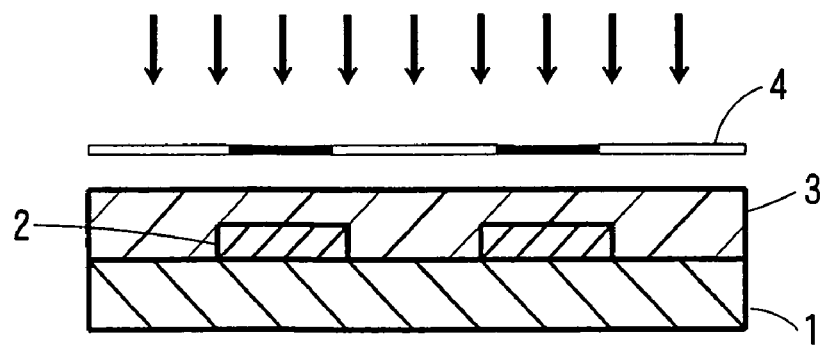

Next, as shown in FIG. 3, a negative (or positive) pattern mask 4 is placed in direct contact with or in non-contacting relationship with the photosensitive resin composition layer 3, and is irradiated with active light rays.

Various known light sources which provide effective irradiation with ultraviolet light are used as a light source of the above-mentioned active light rays. Examples of such light sources include a carbon arclamp, a mercury vapor arc lamp, an ultra-high-pressure mercury-vapor lamp, a high-pressure mercury-vapor lamp, a xenon lamp, and a metal hydride lamp. Light source which provide effective irradiation with visible light are also used. Examples of such light sources include a photoflood lamp and a solar lamp. The irradiation intensity of the active light rays is preferably set within the range of 20 to 2000 mJ/cm$^2$.

Figure 4:
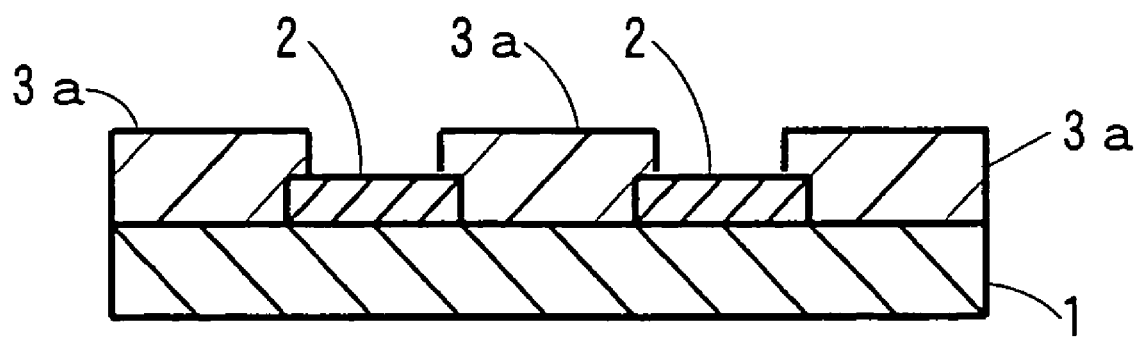

Next, development is carried out using a developing solution such as an alkaline aqueous solution by a known method such as spraying, agitated immersion, brushing, and scrubbing. In the development process, unexposed portions are removed when the negative pattern mask is used, and exposed portions are removed when the positive pattern mask is used. Thus, a solder resist layer 3a is formed, as shown in FIG. 4.

Examples of the alkaline aqueous solution used herein for the above-mentioned development process may include a dilute solution of 0.1% to 5% by weight of sodium carbonate, a dilute solution of 0.1% to 5% by weight of potassium carbonate, a dilute solution of 0.1% to 5% by weight of sodium hydroxide, and a dilute solution of 0.1% to 5% by weight of sodium tetraborate.

Next, a low-pressure mercury-vapor lamp is used to irradiate the above-mentioned solder resist layer 3a with ultraviolet light. The emission wavelength of this low-pressure mercury-vapor lamp is generally characterized in having the maximum peak (or a major peak) at a wavelength of approximately 254 nm and in further having a minor peak at a wave length of 185 nm. The present invention also includes the use of an apparatus (the low-pressure mercury-vapor lamp) which emits ultraviolet light having the above mentioned characteristics.

The dose of ultraviolet light by the use of the above-mentioned low-pressure mercury-vapor lamp is preferably set within the range of 100 to 5000 mJ/cm$^2$, particularly preferably within the range of 200 to 3000 mJ/cm$^2$. Preferably, the irradiation with the ultraviolet light at the above-mentioned dose by the use of the low-pressure mercury-vapor lamp promotes a further photo-curing reaction of the solder resist layer 3a to result in improvements in chemical resistance, thereby suppressing the separating of the mixed additive (in particular, the cyclic phosphazene compound) in a high-temperature and high-humidity atmosphere.

After the irradiation with ultraviolet light by the use of the above-mentioned low-pressure mercury-vapor lamp, irradiation with ultraviolet light by the use of a high-pressure mercury-vapor lamp may be performed as well as heating, as required, for purposes of improving the solder heat resistance, the chemical resistance, and the like. The dose of ultraviolet light irradiation in this instance is preferably set within the range of approximately 0.2 to 10 j/cm$^2$. The above-mentioned heating is preferably performed at a temperature ranging from approximately 100° C. to 180° C. for 15 to 120 minutes. The ultraviolet light irradiation and the heating may be executed in any order. Further, only one of the ultraviolet light irradiation and the heating may be executed.

In this manner, the wiring circuit board formed with the solder resist layer 3a is manufactured. Electronic components including LSI circuits, diodes, transistors, capacitors and the like are mounted by soldering or the like on the wiring circuit board manufactured according to the present invention. Thus, mounted boards are built in various electric and electronic devices.

Next, an inventive example will be described in conjunction with a comparative example. It should be noted that the present invention is not limited to the examples.

INVENTIVE EXAMPLE

[Synthesis of Alkali-Soluble Polymer]

First, 250 g of ethyl diglycol acetate (a first charge) as a solvent was introduced into a one-liter separable flask in a nitrogen atmosphere, and was heated up to 100° C. while stirring. After thermal insulation for 30 minutes, a solution was obtained by mixing and solving together 250 g of phenoxy ethyl acrylate, 100 g of methacrylic acid, and 150 g of methyl methacrylate, each as a monomer, 8.0 g of azobisisobutyronitrile as a catalyst, and 105 g of ethyl diglycol acetate (a second charge) as a solvent. Then, the solution was dropped into the separable flask over three hours to cause a reaction. Further, after stirring at 100° C. for two hours, cooling was done to obtain an alkali-soluble polymer solution (having a solid concentration of 58.5% by weight).

Next, a photosensitive resin composition solution was prepared by preparing components listed below and mixing the components in amounts listed below.

a: 68.4 parts by weight of the above-mentioned alkali-soluble polymer solution b: 18 parts by weight of an ethylene-unsaturated-group-containing polymerizable compound (bisphenol A ethylene oxide modified dimethacrylate; BPE500 manufactured by Shin-Nakamura Chemical Co., Ltd.)

c: 9 parts by weight of a flame retardant (aromatic phosphoric ester; CR747 manufactured by Daihachi Chemical Industry Co., Ltd.)

d: 9 parts by weight of a flame retardant (a cyclic phosphazene compound; SPE-100 manufactured by Otsuka Chemical Co., Ltd.)

e: 2.7 parts by weight of a photopolymerization initiator (IRGACURE 907 manufactured by Nihon Ciba-Geigy K. K.)

f: 2.7 parts by weight of a photopoilymerization initiator (KAYACURE DETS-X manufactured by Nippon Kayaku Co., Ltd.)

g: 17 parts by weight of a phosphorus-containing epoxy resin (FX-305 manufactured by Tohto Kasei Co., Ltd.)

h: 0.2 part by weight of a pigment (phthalocyanine blue)

i: 0.4 part by weight of an adhesion imparting agent/a rust inhibitor (5-amino-1-H-tetrazole)

j: 1 part by weight of an antifoaming agent (acrylic copolymer; MODAFLOW manufactured by CBC Materials Co., Ltd.)

[Production of Wiring Circuit Board]

A substrate including an insulating film (having a thickness of 25 μm) made of polyimide and a copper wiring pattern formed on the insulating film was prepared. Next, a surface of the above-mentioned substrate on which the copper wiring pattern was formed was coated with the prepared photosensitive resin composition solution by a screen printing method such that the photosensitive resin composition solution had a thickness of 20 μm after drying. The photosensitive resin composition solution was dried (at 80° C. for 30 minutes) to form a photosensitive resin composition layer.

Next, a cover film made of polyethylene terephthalate (PET) and having a thickness of 38 μm was brought into intimate contact with the above-mentioned photosensitive resin composition layer. Then, a high-pressure mercury-vapor lamp was used to provide irradiation with ultraviolet light through a negative mask having a predetermined pattern, at a dose of 300 mJ/cm$^2$.

Next, the above-mentioned cover film was removed. Development was carried out using 1% by weight of a sodium carbonate aqueous solution at 25° C. at a pressure of 0.2 MPa for 90 seconds. Further, ion-exchanged water was used for cleaning for 30 seconds. Thus, a solder resist layer having a predetermined pattern was formed using the photosensitive resin composition.

Thereafter, a low-pressure mercury-vapor lamp (having the maximum peak at a wavelength of approximately 254 nm; a UV irradiation apparatus under the trade name of VUM-3164-D manufactured by ORC Manufacturing Co., Ltd., lamp type under the trade name of VUV-4051B-05U) was used to provide irradiation with ultraviolet light at a dose of 2000 mJ/cm$^2$. Subsequently, the solder resist layer is subjected to a heating treatment in a hot air circulating dryer at 150° C. for 30 minutes. In this manner, an intended wiring circuit board formed with the solder resist layer having a predetermined pattern was produced.

The dose of the ultraviolet light was measured by using an actinometer (UV-351-25 manufactured by ORC Manufacturing Co., Ltd.).

COMPARATIVE EXAMPLE

The ultraviolet light irradiation using the low-pressure mercury-vapor lamp was not carried out. Except for this condition, Comparative Example was similar to Inventive Example. In this manner, a wiring circuit board formed with a solder resist layer having a predetermined pattern was produced.

The wiring circuit boards produced in a manner described above according to Inventive and Comparative Examples were introduced into a thermo-hygrostat at 80° C. and at 95% RH. After a lapse of 250 hours, the wiring circuit boards were taken out of the thermo-hygrostat. The solder resist layer surfaces of the respective wiring circuit boards were observed with a microscope of 50 times power to visually inspect the presence of separated material. As a result, no separated material was observed in the product of Inventive Example. On the other hand, separated material was observed in the product of Comparative Example. This separated material was analyzed by using an FTIR (μ-FT-IR; NICOLET 4700+Continuum manufactured by Thermo Electron Corporation). The result of the analysis showed that the main ingredient of the separated material was a cyclic phosphazene compound.

Further, the solder resist layer surfaces of the respective wiring circuit boards obtained were lightly rubbed back and forth 100 times with a cotton swab impregnated with ethanol. Thereafter, the surface of the cotton swab was visually observed. The results showed that a blue color which is a pigment component in the solder resist layer did not adhere to the cotton swab surface in the product of Inventive Example, whereas, the blue color adhered to the cotton swab surface in the product of Comparative Example.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

Japanese Patent Application No. JP2007-079623 is herein incorporated by reference.

What is claimed is:

1. A method of manufacturing a wiring circuit board, comprising:

forming a predetermined conductor circuit pattern on a base material;

forming a photosensitive resin composition layer on a surface of the base material on which the conductor circuit pattern is formed by using a photosensitive resin composition containing a cyclic phosphazene compound;

irradiating a surface of the photosensitive resin composition layer with active light rays through a photomask having a predetermined pattern, thereby exposing the surface of the photosensitive resin composition layer to the active light rays;

forming a solder resist layer having a predetermined pattern by using a developing solution after the exposure step; then irradiating the solder resist layer with ultraviolet light at a dose of 200 to 3000 mJ/cm$^2$ by using a low-pressure mercury-vapor lamp thereby suppressing the separating of the cyclic phosphazene compound; and then subjecting the solder resist layer to irradiation with ultraviolet light by the use of a high-pressure mercury-vapor lamp.

2. The method of claim 1, wherein the photosensitive resin composition comprises the following components:

(A) a carboxyl-group-containing linear polymer;
(B) a thylene-unsaturated-group-containing polymerizable compound;
(C) a photopolymerization initiator; and
(D) a phosphorus-containing epoxy resin.

\* \* \* \* \*